United States Patent
Gudesen et al.

(10) Patent No.: US 7,126,176 B2
(45) Date of Patent: Oct. 24, 2006

(54) MEMORY CELL

(76) Inventors: Hans Gude Gudesen, Hans Petters vei, 1639 Gamle Fredrikstad (NO); Per-Erik Nordal, Båstadryggen 19, 1387 Asker (NO)

( * ) Notice: Subject to any disclaimer, the term of this patent is extended or adjusted under 35 U.S.C. 154(b) by 59 days.

(21) Appl. No.: 10/504,860

(22) PCT Filed: Feb. 11, 2003

(86) PCT No.: PCT/NO03/00052

§ 371 (c)(1), (2), (4) Date: Aug. 30, 2004

(87) PCT Pub. No.: WO03/075279

PCT Pub. Date: Sep. 12, 2003

(65) Prior Publication Data

US 2005/0151176 A1    Jul. 14, 2005

(30) Foreign Application Priority Data

Mar. 1, 2002  (NO) ................................ 20021057

(51) Int. Cl.
*H01L 29/76* (2006.01)
(52) U.S. Cl. .................. 257/295; 365/145; 365/146
(58) Field of Classification Search ............ None
See application file for complete search history.

(56) References Cited

U.S. PATENT DOCUMENTS

| | | | |
|---|---|---|---|
| 5,270,967 A * | 12/1993 | Moazzami et al. ......... 365/145 |
| 6,498,744 B1 | 12/2002 | Gudesen et al. ............ 365/145 |
| 6,670,659 B1 | 12/2003 | Gudesen et al. ............ 257/295 |
| 6,734,478 B1 * | 5/2004 | Johansson et al. ......... 257/295 |
| 2003/0103386 A1 * | 6/2003 | Broms et al. ........... 365/189.01 |

FOREIGN PATENT DOCUMENTS

| | | |
|---|---|---|
| DE | 3602887 | 8/1987 |
| JP | 10022470 | 1/1998 |
| WO | 98/58383 | 12/1998 |
| WO | 99/12170 | 3/1999 |
| WO | 02/05287 | 1/2002 |

OTHER PUBLICATIONS

S. B. Desue "Minimization of Fatigue in Ferroelectric Films", Phys. Stat. Sol. (a) 151, 467-480 (1995).
K. -S. Liu and T. -F. Tseng: "Improvement of $(Pb_{1-x}La_x)(Zr_yTi_{1-y})_{1-x/4}O_3$ ferroelectric thin films by use of SRRuO$_3$/Ru/Pt/Ti bottom electrodes", Appl. Phys. Lett. 72 1182-1184 (1998).
S. Aggarwal et al, "Switching properties of Pb (Nb, Zr, Ti) O$_3$ capacitors using SrRuO$_3$ electrodes", Appl. Phys. Lett. 75 1787-1789 (1999).

* cited by examiner

*Primary Examiner*—Andy Huynh
*Assistant Examiner*—Hoang-Quan Ho
(74) *Attorney, Agent, or Firm*—Jacobson Holman PLLC

(57) ABSTRACT

In a ferroelectret or electret memory cell a polymeric memory material is a blend of two or more polymeric materials, the polymeric material being provided contacting first and second electrodes. Each electrode is a composite multilayer having a first highly conducting layer and a conducting polymer layer, the latter forming a contact between the former and the memory material.

13 Claims, 2 Drawing Sheets

MEMORY CELL

This is a nationalization of PCT/NO03/00052 filed Feb. 11, 2003 and published in English.

The present invention concerns a memory cell comprising a polymeric memory material with ferroelectric or electret properties and capable of being polarized and exhibiting hysteresis and wherein the polymeric memory material is provided contacting first and second electrodes, and wherein the polymeric material is a blend of at least a first and a second polymeric material, said first polymeric material being a ferroelectric or electret polymeric material. The present invention also concerns a method for pre-use conditioning of a memory cell comprising a polymeric memory material with ferroelectric or electret properties and capable of being polarized and exhibiting hysteresis and wherein the polymeric memory material is provided contacting first and second electrodes, and wherein the polymeric material is a blend of at least a first and a second polymeric material, said first polymeric material being a ferroelectric or electret polymeric material.

Particularly the present invention concerns data storage and/or processing devices based on structures where thin films of polymeric electrets or ferroelectrics are subjected to electric fields set up by electrodes that form part of the structure.

During recent years, non-volatile data storage devices have been demonstrated where each bit of information is stored as a polarization state in a localized volume element of an electrically polarizable material. Non-volatility is achieved since the material can retain its polarization even in the absence of externally imposed electrical fields. Hitherto, the polarizable materials have typically been ferroelectric ceramics, and the writing, reading and erasing of data has entailed the application of electric fields to the ferroelectric material in localized cells in the memory devices, causing the material in a given cell to switch or not switch its direction of polarization, depending on its previous electrical history.

During normal operation of the device in question, the ferroelectric may be subjected to electrical stress of a prolonged or repeated nature and/or numerous polarization reversals. This may cause the ferroelectric to suffer fatigue, i.e. deterioration of the electrical response characteristics required for normal operation of the device. Thus, the ferroelectric material may exhibit reduced remanent polarization which results in reduced switching current signals upon induced polarization reversal. Also, the fatigue process is sometimes accompanied by increased coercive field which makes the device harder to switch from one polarization direction to another and slows down the switching process.

Another undesirable aging phenomenon is the development of imprint; i.e.: If a ferroelectric memory cell is left in a given polarization state for a period of time, it may become increasingly difficult to reverse the polarization direction, and an asymmetry develops in the fields required to switch the polarization in either direction.

Imprint may also exacerbate problems related to another phenomenon occurring in passive matrix addressed memory devices in particular, namely disturb: This pertains to a change in the polarization state of the ferroelectric, typically the loss of polarization or even the occurrence of polarization reversal, when the ferroelectric is unintentionally subjected to repeated or prolonged electrical fields of magnitude less than the coercive field. Such disturbing fields may arise in non-addressed memory cells as a side effect of the normal operation of the device. An example is the $V_S/3$ voltage exposure on non-addressed cells in a passive matrix during writing operations employing a write voltage $V_S$ on the addressed cells (cf., e.g. discussion of pulsing protocols in Norwegian patent application No. 20003508, belonging to the present applicant).

Resolution of the problems related above is essential for successful commercialisation of ferroelectric-based devices as discussed here. Much effort has been spent on these issues as pertaining to devices employing inorganic ferroelectrics. The latter are essentially based on two families of perovskites, i.e. lead zirconate titanate (PZT) and layered perovskites such as strontium bismuth tantalate (SBT) and lanthanum-modified bismuth titanate (BLT). Among these, SBT and BLT exhibit good fatigue-resistance in simple capacitor-like memory cell structures with metal electrodes such as Pt. However, polarization, electrical leakage and switching characteristics are inferior as compared to PZT, in addition to high temperatures being required during manufacturing. On the other hand, initial attempts to use PZT in conjunction with metal electrodes proved unsuccessful for most memory applications due to rapid deterioration during repeated switching. As a result of intensive research efforts, it was shown that integral constituents of the ferroelectric material, e.g. oxygen in PZT, are lost during the switching of the ferroelectric, leading to vacancies that migrate towards the electrodes and create pinning sites that inhabit domain switching and bring on fatigue in the devices. A strategy which has proven successful in countering this phenomenon is to employ conductive oxide electrodes, preferably with a lattice structure the same or similar to that of the bulk ferroelectric, which neutralize the oxygen vacancies that arrive at the electrode/ferroelectric interface. Examples of candidates for electrode materials in the case of oxide ferroelectrics such as PZT are $RuO_2$, $SrRuO_2$, indium tin oxide (ITO), $LaNiO_3$, lanthanum strontium cobaltate (LSCO) and yttrium barium copper oxide (YBCO). An alternative to the above-referred strategy of providing a supply of critical atomic species in the electrodes is to insert sinks for vacancies in the bulk ferroelectric via doping and/or adjustment of stoichiometries. This approach has been used on PZT by introducing donor dopants such as Nb and La, which substitute into Zr or Ti sites and neutralize the oxygen vacancies.

Further refinements and adaptations to different inorganic ferroelectric compositions have emerged, constituting a large body of prior art relating to inorganic, and in particular ceramic ferroelectric films. For further background information on prior art, the reader is referred to, e.g.: S. B. Desu "Minimization of Fatigue in Ferroelectric Films", Phys.Stat. Sol. (a) 151, 467–480 (1995); K.-S. Liu and T.-F. Tseng: "Improvement of $(Pb_{1-x}La_x)(Zr_yTi_{1-y})_{1-x/4}O_3$ ferroelectric thin films by use of $SrRuO_3/Ru/Pt/Ti$ bottom electrodes", Appl.Phys.Lett. 72 1182–1184 (1998), and S. Aggarwal et al.: "Switching properties of $Pb(Nb,Zr,Ti)O_3$ capacitors using $SrRuO_3$ electrodes", Appl.Phys.Lett. 75 1787–1789 (1999). As shall be expounded below, however, the present inventors are not aware of any, relevant prior art in the present context of fatigue reduction in devices employing organic or polymeric electrets or ferroelectrics.

As described in patent applications filed by the present applicant organic-based and in particular polymeric ferroelectric materials may provide very considerable advantages for use in memory and/or processing devices as compared to their inorganic counterparts. However, fatigue and imprint problems have been found to be present in polymer-based ferroelectrics also. If these problems are not solved, this will significantly reduce the commercial potential for devices based on such materials. Unfortunately, remedies that have been developed for counteracting fatigue in inorganic ferroelectrics cannot provide help in this case, due to fundamental differences in chemistry and in basic ferroelectric properties (e.g. displacive vs. permanent dipoles).

Thus, there exists a need for strategies and remedies that can combat fatigue, imprint and disturb phenomena in memory and/or processing devices based on organic and in particular polymeric electrets or ferroelectrics.

In accordance with the above, it is a major object of the present invention to provide basic strategies for avoiding or reducing the deleterious effects of electrical field stress on organic, in particular polymeric electret or ferroelectric materials employed in devices for data storage and/or processing.

It is a further object of the present invention to provide explicit descriptions of memory cell structures where the basic mechanisms of switching fatigue, imprint and disturb are prevented or delayed from becoming operative.

It is yet a further major object of the present invention to enumerate particular classes of materials for incorporation in fatigue-, imprint- and disturb-resistant device structures and list preferred embodiments of particular relevance.

The above-mentioned objects as well as further features and advantages are achieved with a memory cell according to the present invention, which is characterized in that each electrode is a composite multilayer electrode comprising a first layer of highly conductive material and a second layer of conducting polymer, the conducting polymer forming a contact layer between the highly conductive material and the memory material.

Preferably the first polymeric material is a copolymer and preferably the second polymeric material is a homopolymer, while preferably the highly conductive material can be a metallic material.

Preferably a barrier layer is provided between the first and second layer of the electrode and in case the highly conductive material is a metallic material, the barrier layer is an oxide, nitride or boride of said metallic material.

In a first preferred embodiment of the memory cell according to the invention the memory material is provided in sandwiched between the electrodes.

In a second preferred embodiment of the present invention the electrodes are provided on opposite surfaces of a bridge of insulating material, the first electrode extending beyond the insulating bridge, and the memory material is provided on exposed surfaces of the first and second electrodes and extending between the electrodes over the side surfaces of the insulating bridge.

In the preferred embodiments of the memory cell according to the invention it is advantageous that the memory material and the electrodes are provided as layers of thin film, such that the memory cell constitutes a layered thin-film structure.

The above-mentioned objects as well as further features and advantages are also achieved with a method for pre-use conditioning of a memory cell according to the invention which is characterized by applying to the electrodes a voltage pulse train of alternating positive and negative pulses generating an electric field capable of polarizing the memory material in either direction, and subjecting the memory material to a number of successive reversals of the polarization direction thereof.

Finally, a memory cell according the invention is used in either a passive or active matrix-addressable ferroelectric or electret memory device.

BRIEF DESCRIPTION OF THE DRAWINGS

The invention shall be better understood from the following detailed description of various preferred embodiments and with reference to the drawing figures, of which

Now follows a brief discussion of various prior art generic embodiments of memory cells as a background and introduction to the present invention which is based in its general aspects on structurally similar memory cells.

Figure 1:
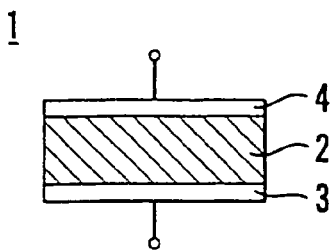
FIG. 1 shows a schematic cross section of a first embodiment of a generic memory cell according to prior art, FIG. 2 a second a schematic cross section of a second embodiment of a generic memory cell according to prior art, FIG. 3 hysteresis curves for a ferroelectric material before and after fatigue, FIG. 4 a schematic cross section of a first preferred embodiment of the memory cell, according to the invention, and structurally corresponding to the generic embodiment of FIG. 1, FIG. 5 a schematic cross section of a second preferred embodiment of the memory cell according to the invention and structurally corresponding to the generic embodiment in FIG. 1, FIG. 6 a schematic cross section of a third preferred embodiment of the memory cell according to the invention and structurally corresponding to the generic embodiment in FIG. 2.

FIG. 1 shows a conventional generic embodiment of a prior art memory cell 1. The memory cell 1 comprises a memory material 2, e.g. a ferroelectric or electret inorganic or organic material and in the latter case preferably a polymer, sandwiched between a first electrode 3 and a second electrode 4. This is a purely passive memory cell, but it can be connected with a switching transistor to form an active memory cell. This latter can be of the type consisting of one transistor and one memory cell and termed a 1T-1C memory circuit of they can be made of more than one transistor and one memory cell and so on, forming e.g. 2T-2C memory circuits etc. The memory material 2 is polarized by an electric field generated when voltage is applied to the electrodes 3,4.

Figure 2:
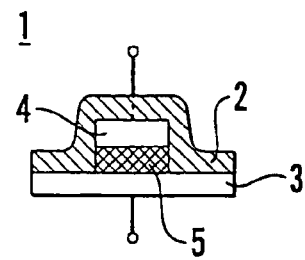

FIG. 2 shows another generic embodiment of a prior art memory cell 1. Herein the first and second electrodes 3,4 are mutually isolated by a bridge of insulating material 5, while the first electrode 3 extends somewhat beyond the insulating bridge 5. The memory material 4 is then provided on the exposed surface of the electrodes 3, 4 and covering these as well as the side surfaces of the insulating bridge 5. In this case the memory material 2 is polarized in the region extending between the first and second electrodes 3,4 in vicinity of and adjacent to the side surfaces of the insulating bridge 5. Also in this case it will be the stray electric field generated when applying voltage to the electrodes 3,4 which causes the polarization of the memory material 2.

Figure 3:
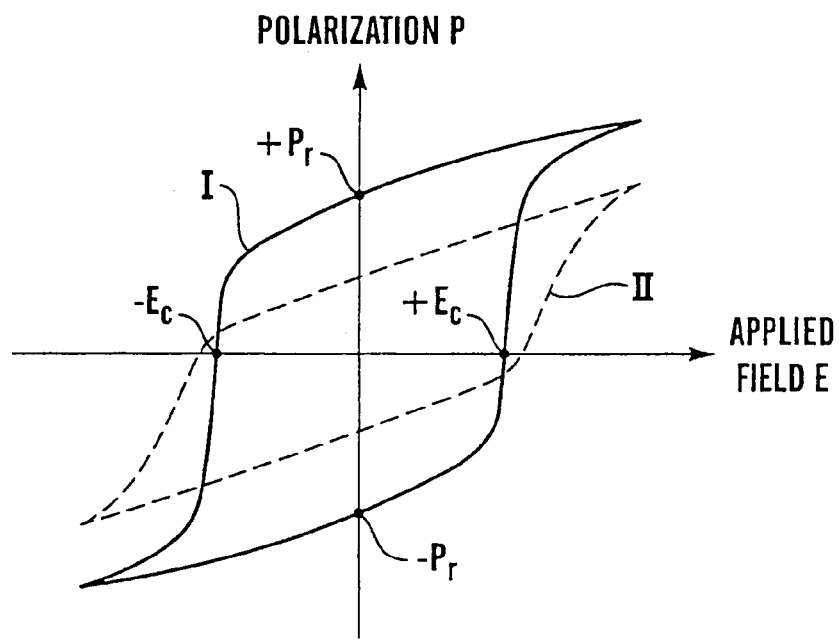

FIG. 3 shows the hysteresis curves for the polarization of a ferroelectric or electret material of ferroelectric or electret material versus an applied electric field E. The generated polarization P may be positive ($+P_r$) or negative ($-P_r$) according to the polarity of the applied electric field. The first hysteresis loop I denotes the hysteresis curve of a ferroelectric or electret material that has not been subjected to fatigue, i.e. the reduction in the attainable polarization after a large number of switching cycles. After being subjected to the fatigue the ferroelectric or electret material may show a hysteresis loop similar to the second hysteresis curve II and it will be seen that the attainable polarization of the material has been considerably reduced when compared with hysteresis curve I. In FIG. 3 $+E_c$ and $-E_c$ denote respectively the positive and negative coercive electric field. It should, however, be noted that $E_c$ need not be the same for hysteresis curves I and II in fact the coercive field $E_c$ is somewhat higher for hysteresis curve II.

Figure 4:
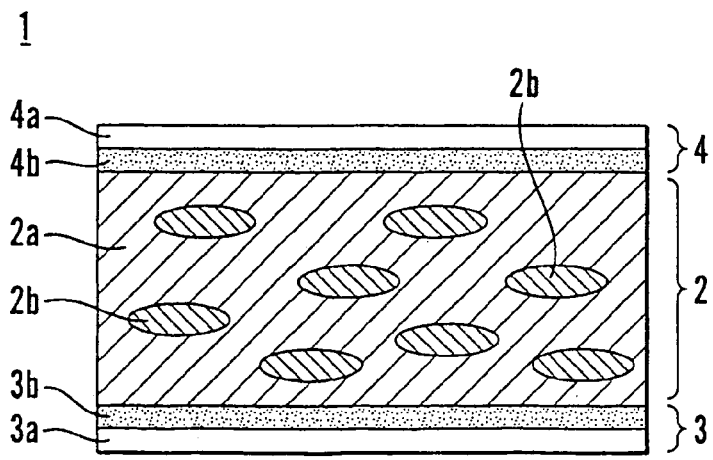

Now a first preferred embodiment of the memory cell according to the present invention shall be elucidated in somewhat more detail with reference to FIG. 4. For convenience the memory cell 1 depicted in FIG. 4 shall be regarded as ferroelectric, i.e. the memory material 2 shows a ferroelectric behaviour, although it could for the sake of that be electret material which likewise will be capable of being polarized and exhibiting hysteresis. The layer 2 of memory material is provided in sandwich between first and second electrodes 3 and 4 which contact the memory material on either side thereof. As will be seen from FIG. 4 each electrode 3,4 are provided as bilayer electrodes. The layer 3a in electrode 3 is a highly conductive material, e.g. a metallic material, and the second layer 3b is a conducting polymer which e.g. could be PEDOT, PANI, polypyrrole or other polymers with conducting properties. The second electrode 4 comprises similarly a first layer of a highly conductive material 4a which can be a metallic material and likewise a second layer 4b of conducting polymer. It is to be understood that the materials in both electrodes preferably shall be similar and that as the highly conductive material a metallic conductor e.g. a titan or aluminium may be preferable.

Concerning the memory material 2, it should be noted that in order to optimize ferroelectric memory material based on polymers, it has been proposed to blend a ferroelectric polymer with other polymers, not necessarily showing a ferroelectric behaviour. Also a blend of a strongly polarizable and a more weakly polarizable polymer has been attempted. Besides, the use of various copolymers has been known in the art at least since 1980. In that connection reference can be made to German laid-open application DE-OS 36 02 887 A1 assigned to Bayer AG, and which discloses the use of ferroelectric capacitors in static or dynamic RAMs (SRAM or DRAM). In addition to inorganic ferroelectric materials this publication also proposes organic ferroelectric materials such as polymers with easily polarizable atoms and in that case specifically polyolefines with fluor atoms and similar to polyvinylidene difluoride, or polymers with strongly polarizable end groups such as polyvinylidene cyanide (PVCN). The desired optimization of this memory materials can take place using copolymers, for instance such as PVDF-TrFE, or blends e.g. with polymetylmetacrylat PMMA, or copolymers of PVCN with polyvinylacetat.

The memory material 2 thus provided in sandwich between the electrodes 3,4 is a blend in a specific proportion of a first polymeric material 2a, which in this case of course is a ferroelectric polymer. More particularly the material 2a can be a copolymer, e.g. PVDF-TrFE, while a second polymeric material 2b is depicted in the figure as islets in the memory material 2. This second polymeric material 2b forming the blend is preferably a homopolymer, e.g. of PVDF.

Figure 5:
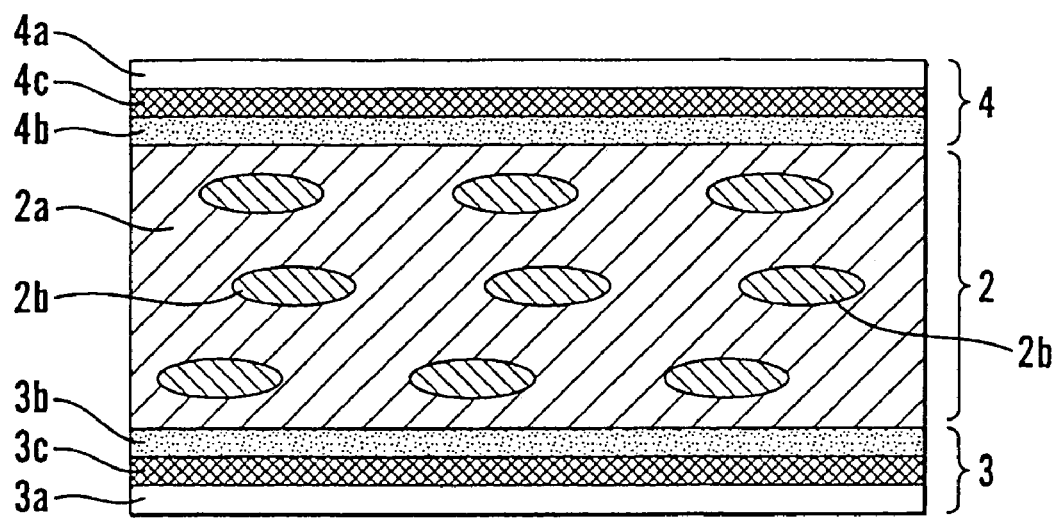
Figure 6:
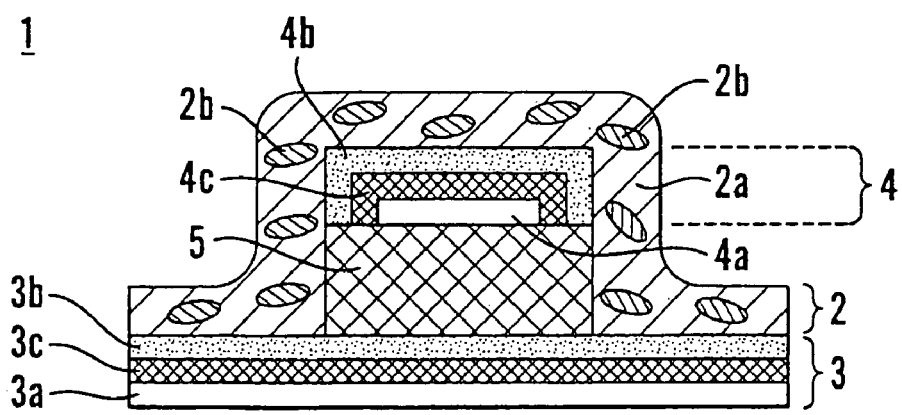

A second preferred embodiment of the memory cell 1 according to invention is shown in FIG. 5 wherein the same features are denoted with the same reference numerals as the embodiment in FIG. 3 and in all respect similar as regards materials and structures. Hence a discussion of the latter shall not be given in this case. The main difference between the embodiment in FIG. 4 and the embodiment in FIG. 5 is that a barrier layer 3c;4c has been provided in the electrodes 3;4 between the layers 3a;4a of a highly conductive material and the layers 3a;3b of a conducting polymer. The primary function of the barrier layer is to prevent any undesirable reactions between the highly conductive material in layer 3a;4a and the conducting polymer in layers 3b;4b. If the highly conducting material of layers 3a, 4a is a metallic material, e.g. aluminium or titanium, the barrier layer could be provided as an oxide, nitride or boride thereof and being formed in a process step immediately subsequent to deposition of the metallic material by subjecting the latter to an oxidizing nitridizing or boridizing treatment, as will be well understood by persons skilled in the art:

A third preferred embodiment of the memory cell according to the invention is shown in schematic cross section in FIG. 6 and corresponds to the generic embodiment in FIG. 2. Herein the memory material 2 is not provided in sandwich, but above the electrodes 3,4. The first electrode 3 is similar to the electrode shown in the second embodiment of FIG. 5, i.e. formed with three layers 3a,3b,3c as is the case of the embodiment in FIG. 5. A bridge of insulating material 5 is provided above the first electrode 3 such that the latter extends somewhat beyond the insulating bridge 5 with the surface of the layer 3b of conducting polymer exposed. The second electrode 4 is now provided on the insulating bridge 5 and is in all respects-structurally similar to the first electrode 3. The first layer 4a of highly conductive material 4 is covered by the barrier layer 4c and thereabove the layer 4b of conducting polymer is provided with its exterior surface exposed. Now the memory material 2a consisting of the blend of the two polymeric materials 2a, 2b which will for all practical purposes are similar to those mentioned above is provided over the electrodes in the manner depicted in FIG. 6c, i.e. contacting the conducting polymer layer 3b, 4b of the electrodes 3,4. The memory material 2 extends over the side edge of the insulating bridge 5. When applying a voltage to the electrodes the polarizing field generated will now be a stray field extending over the side of the insulating bridge 5 between electrodes. Depending on the geometric proportions involved in the structural features of the embodiment in FIG. 6, the polarizing field could also generated as an inclined lateral field extending between the electrodes 3,4. In any case a polarized region will be formed in the memory material 2 at the side edges of the bridged electrode arrangement of the memory cell 1. The advantage of the embodiment in FIG. 6 is particularly that the memory material 2 comprising the blend of two polymeric materials 2a, 2b can be laid down in a final step, thus avoiding its being subjection to non-compatible chemical or thermal regimes in the process steps for providing the electrodes 2,3.

In the fabrication process the memory cell 1 will be subjected to a heat treatment, usually with fairly low temperatures and typically in a range between 100° C. and 150° C. However, in order to obtain a memory cell according to the invention with the desired functional properties, it may be necessary to subject the cell to a pre-use conditioning before its actually application a memory cell e.g. in a memory device. This pre-use conditioning is carried out by applying a pulse train of alternating positive and negative voltage pulses to the electrodes of the memory cell for a certain number of pulses or cycles. The applied voltages shall be capable of generating an electric field between the electrodes capable of polarizing the memory material in either positive or negative direction depending on the polarity of the voltage pulses. The applied voltage pulses shall now cause a succession of reversals of the polarization direction in the memory material. In this pre-use conditioning it is evident that pulse duration and amplitude must be selected and adjusted so as to obtain the desired polarization effect, i.e. timing and amplitude must be taken into regard. Typically the time needed to effect the polarization reversal. i.e. a switching of all the polarization state of the memory cell will be in the order of some microseconds, e.g. about 50 microseconds. The memory cell may be subjected to a large number of switchings or polarization reversals in the pre-use conditioning. The number of switchings may exceed 10 000 and possibly be much larger but the selection of parameters for an optimum pre-use conditioning is subject to heuristics.

Memory cells according to the invention may be used as memory cells in passive matrix-addressable memory devices, in which case the memory material, in a preferred embodiment will be provide as a continuous layer sandwiched between first and second electrode layers, the electrodes of which being provided as strip-like parallel electrodes such that electrodes in the first electrode layers are oriented orthogonal to the electrodes in the second layer, the electrodes thus forming an orthogonal electrode matrix wherein the memory cells now will be defined in the portion of the memory material between crossing electrodes of the electrode layers. A passive matrix-addressable memory device based on the embodiment in FIG. 6 can be similarly devised and is moreover the subject of Norwegian patent 309 500 and shall hence not be discussed in further detail herein.

Tests have shown that a memory cell of the present invention and subjected to the pre-use conditioning exhibit excellent fatigue resistance, while a suitable choice of parameters for the pre-use conditioning also may serve to make the memory cell much less prone to imprint and disturb. But first and foremost the memory cell according to the invention has turned out to be practically immune to fatigue, thereby providing a memory cell with polarization properties that do not deteriorate over as a large number of switching cycles in ordinary use as can be envisaged for a successful application in ferroelectric or electret memory devices.

The invention claimed is:

1. A memory cell comprising
a polymeric memory material with ferroelectric or electret properties and exhibiting hysteresis and the polymeric memory material being provided contacting first and second electrodes, and the polymeric material being a blend of at least a first and a second polymeric material subjected to a pre-use conditioning before application to data storage, said pre-use conditioning including applying a pulse train of alternating positive and negative voltage pulse to the electrodes so that an electric field capable of polarizing a memory material in either direction is generated and the polymeric material is subjected to a number of successive reversals of a polarization direction thereof, said first polymeric material being a ferroelectric or electret polymeric material.

2. The memory cell according to claim 1, wherein the first polymeric material is a copolymer.

3. The memory cell according to claim 1, wherein the second polymeric material is a homopolymer.

4. The memory cell according to claim 1, wherein the first layer of highly conductive material is a metallic material.

5. A memory cell comprising
a polymeric memory material with ferroelectric or electret properties and capable of being polarized and exhibiting hysteresis and the polymeric memory material being provided contacting first and second electrodes, and the polymeric material being a blend of at least a first and a second polymeric material, said first polymeric material being a ferroelectric or electret polymeric material, each electrode being a composite multilayer electrode having a first layer of highly conductive material and a second layer of conducting polymer, the conducting polymer forming a contact layer between the highly conductive material and the memory material, a barrier layer being provided between the first and the second layer of the electrode.

6. The memory cell according to claim 5, wherein the first layer of highly conductive material is a metallic material, and the barrier layer is an oxide, nitride or boride of said metallic material.

7. The memory cell according to claim 1, wherein the memory material is provided sandwiched between the electrodes.

8. A memory cell comprising
a polymeric memory material with ferroelectric or electret properties and capable of being polarized and exhibiting hysteresis and the polymeric memory material being provided contacting first and second electrodes, and the polymeric material being a blend of at least a first and a second polymeric material, said first polymeric material being a ferroelectric or electret polymeric material, each electrode being a composite multilayer electrode having a first layer of highly conductive material and a second layer of conducting polymer, the conducting polymer forming a contact layer between the highly conductive material and the memory material, the electrodes being provided on opposite surfaces of a bridge of insulating material, the first electrode extending beyond the insulating bridge, and the memory material being provided on exposed surfaces of the first and second electrodes and extending between the electrodes over side surfaces of the insulating bridge.

9. The memory cell according to claim 1, wherein the memory material and the electrodes are provided as layers of thin film such that the memory cell constitutes a layered thin-film structure.

10. A method for pre-use conditioning of a memory cell comprising a polymeric memory material with ferroelectric or eletret properties and capable of being polarized and exhibiting hysteresis, the polymeric memory material being provided contacting first and second electrodes, the polymeric material being a blend of at least a first and a second polymeric material, said first polymeric material being a ferroelectric or electret polymeric material, the method comprising the steps of
applying to the electrodes a voltage pulse train of alternating positive and negative pulses generating an electric field capable of polarizing the memory material in either direction, and
subjecting the memory material to a number of successive reversals of a polarization direction thereof.

11. The use of a memory cell according to claim 1 in a passive matrix-addressable ferroelectric or electret memory device.

12. The use of the memory cell according to claim 1 in an active matrix-addressable ferroelectric or electret memory device.

13. The method according to claim 10, wherein the number of reversals of the polarization direction exceeds 10000.

* * * * *